(12) United States Patent
Cao et al.

(10) Patent No.: US 7,095,788 B1
(45) Date of Patent: *Aug. 22, 2006

(54) CIRCUIT FOR FACILITATING SIMULTANEOUS MULTI-DIRECTIONAL TRANSMISSION OF MULTIPLE SIGNALS BETWEEN MULTIPLE CIRCUITS USING A SINGLE TRANSMISSION LINE

(75) Inventors: Tai Anh Cao, Austin, TX (US); Lloyd Andre Walls, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1074 days.

This patent is subject to a terminal disclaimer.

(21) Appl. No.: 09/640,802

(22) Filed: Aug. 17, 2000

(51) Int. Cl.
*H04B 3/00* (2006.01)
*H04L 25/00* (2006.01)

(52) U.S. Cl. ............... 375/257; 375/288; 370/537

(58) Field of Classification Search ........... 375/257, 375/288, 296, 287, 242, 250, 214, 230, 290, 375/219, 316, 244, 286; 178/58; 362/83, 362/82; 370/284, 295, 201, 276, 274, 679, 370/537; 326/30, 31, 83, 21; 327/56
See application file for complete search history.

(56) References Cited

U.S. PATENT DOCUMENTS

| | | | | |
|---|---|---|---|---|
| 3,993,867 A | * | 11/1976 | Blood, Jr. | 370/284 |
| 4,604,740 A | | 8/1986 | Gandini et al. | 370/284 |
| 4,638,473 A | | 1/1987 | Cooperman et al. | 370/284 |
| 4,698,800 A | | 10/1987 | Cavaliere et al. | 370/284 |
| 4,703,198 A | | 10/1987 | Porter et al. | 326/86 |
| 4,713,827 A | | 12/1987 | Lauffer et al. | 375/219 |
| 4,719,369 A | | 1/1988 | Asano et al. | 326/30 |
| 4,756,006 A | | 7/1988 | Rickard | 375/219 |
| 4,791,668 A | | 12/1988 | Pringle | 379/398 |
| 4,811,342 A | | 3/1989 | Huang | 370/292 |
| 4,859,877 A | | 8/1989 | Cooperman et al. | |
| 5,030,855 A | | 7/1991 | Leung | |
| 5,095,231 A | | 3/1992 | Sartori et al. | |
| 5,107,230 A | | 4/1992 | King | |
| 5,111,080 A | | 5/1992 | Mizukami | |
| 5,134,311 A | | 7/1992 | Biber et al. | |
| 5,216,667 A | | 6/1993 | Chu et al. | |
| 5,260,612 A | | 11/1993 | Lehmann et al. | |
| 5,282,157 A | | 1/1994 | Murphy et al. | |

(Continued)

OTHER PUBLICATIONS

Lam, Kevin, Larry R. Dennison, and William J. Dally, "Simultaneous Bidirectional Signalling for IC Systems", IEEE Photonics Technology letter, pp. 430-433, 1990.

(Continued)

*Primary Examiner*—Chieh M. Fan
*Assistant Examiner*—Ted M. Wang
(74) *Attorney, Agent, or Firm*—Casimer K. Salys; Russell D. Culbertson; The Culbertson Group, P.C.

(57) ABSTRACT

An encoding element (109, 111, 113) and a decoding arrangement (110, 112, 114) is included with each separate circuit (104, 105, 106) in a system (100) of circuits which must communicate digital signals with each other. The encoding devices (109, 111, 113) included with the separate circuits (104, 105, 106) cooperate to produce an encoded signal on a common transmission line or network (108) which interconnects the various circuits. The decoding arrangement (110, 112, 114) associated with each respective circuit receives the encoded signal appearing on the transmission line and decodes the encoded signal to reproduce or recreate the digital data signals transmitted from the other circuits in the system.

17 Claims, 5 Drawing Sheets

U.S. PATENT DOCUMENTS

| | | |
|---|---|---|
| 5,311,081 A | 5/1994 | Donaldson et al. |
| 5,338,979 A | 8/1994 | Mammano et al. |
| 5,347,177 A | 9/1994 | Lipp |
| 5,382,841 A | 1/1995 | Feldbaumer |
| 5,396,028 A | 3/1995 | Tomassetti |
| 5,422,608 A | 6/1995 | Levesque |
| 5,448,182 A | 9/1995 | Countryman et al. |
| 5,466,975 A | 11/1995 | Wratten |
| 5,481,207 A | 1/1996 | Crafts |
| 5,541,535 A * | 7/1996 | Cao et al. .................. 326/83 |
| 5,568,064 A | 10/1996 | Beers et al. ................. 326/31 |
| 5,568,094 A | 10/1996 | Bowen et al. |
| 5,578,939 A | 11/1996 | Beers et al. ................. 326/30 |
| 5,760,601 A | 6/1998 | Frankeny |
| 5,761,246 A | 6/1998 | Cao et al. |
| 5,793,223 A | 8/1998 | Frankeny |
| 5,815,107 A | 9/1998 | Frankeny et al. |
| 5,913,075 A | 6/1999 | Beers et al. |
| 5,949,982 A | 9/1999 | Frankeny et al. |
| 6,101,561 A | 8/2000 | Beers et al. |
| 6,226,330 B1 * | 5/2001 | Mansur ..................... 375/257 |
| 6,504,875 B1 * | 1/2003 | Perino et al. ............... 375/257 |
| 6,771,675 B1 * | 8/2004 | Cao et al. .................. 370/537 |

OTHER PUBLICATIONS

IBM Technical Disclosure Bulletin, "Failure-Tolerant Self-Testing Driver/Receiver", vol. 30, No. 3, pp. 1215-1220, 1987.

IBM Technical Disclosure Bulletin, "Simultaneous Bidirectional Transceiver Circuit", vol. 23, No. 4, pp. 1435-1437, 1980.

IBM Technical Disclosure Bulletin, "Component Mismatch Accommodation for Bidirectional Chip to Chip Communication", vol. 22, No. 11, pp. 5029-5031, 1980.

IBM Technical Disclosure Bulletin, "Bidirectional Communications within a Binary Switching System", vol. 18, No. 9, pp. 2865-2866, 1976.

IBM Technical Disclosure Bulletin, "Simultaneous Bidirectional Baseband Data Transmission", vol. 11, No. 7, pp. 762-763, 1968.

* cited by examiner

US 7,095,788 B1

CIRCUIT FOR FACILITATING SIMULTANEOUS MULTI-DIRECTIONAL TRANSMISSION OF MULTIPLE SIGNALS BETWEEN MULTIPLE CIRCUITS USING A SINGLE TRANSMISSION LINE

TECHNICAL FIELD OF THE INVENTION

The present invention relates generally to data communications between electronic circuits. More particularly, the invention relates to a system for permitting simultaneous, multi-directional communications between a number of different circuits using a common transmission line.

BACKGROUND OF THE INVENTION

Electronic systems commonly include many different electronic circuits which must communicate data with each other through suitable data transmission lines or networks. A simple data communication arrangement includes a separate transmission line for each individual signal which must be communicated from one circuit to another. However, as integrated circuit technology has advanced, far more circuitry can be placed on an integrated circuit chip than can be accessed externally through separate signal transmission lines. An integrated circuit package will inevitably have room for fewer input/output pins than the number of signals which must be communicated to a separate integrated circuit or received from a separate integrated circuit.

Time division multiplexing may be used to allow different signals to effectively share a common transmission line. In time division multiplexing, a single transmission line carries one signal at one time and another signal at another time. However, time division multiplexing adds complexity to the circuit. Furthermore, since signals are not communicated simultaneously, time division multiplexing reduces the overall speed of data communications.

U.S. Pat. No. 5,761,246 discloses a circuit and signal transmission method in which a number of different signals may be communicated from one circuit to another simultaneously over a single signal transmission line. However, the arrangement shown in the U.S. Pat. No. 5,761,246 facilitates only unidirectional signal transmission. That is, although multiple signals from one circuit are communicated simultaneously to a second circuit over a single transmission line, a separate transmission line was required for transmitting signals from the second circuit back to the first circuit.

U.S. Pat. No. 4,604,740 discloses a digital transceiver allowing full duplex or bi-directional transmission of digital signals over a common transmission line. This transceiver is limited to only bi-directional transmission between two circuits, and does not facilitate multi-directional communications between three or more circuits.

SUMMARY OF THE INVENTION

It is an object of the invention to provide an electronic circuit and circuit arrangement which enables multiple digital signals to be communicated simultaneously in multiple directions between three or more circuits connected by a single transmission line or network. Each circuit in the arrangement may transmit and receive digital data at the same time each other circuit transmits and receives digital data, all using the single signal transmission line.

The object of the invention is accomplished using an encoding and decoding scheme with each separate circuit in a system of circuits. Sending circuitry included with each separate circuit in the system applies a signal from the respective circuit to be transmitted to each other circuit in the system. Each sending circuit includes an encoding element and these encoding elements cooperate to produce an encoded or combined signal on a common transmission line or network which interconnects the various circuits. The decoding arrangement associated with each circuit receives the encoded signal appearing on the transmission line and decodes the encoded signal to provide the digital data signals transmitted from the plurality of other circuits in the system. For example, a system of circuits according to the invention may include a first circuit producing a first data signal, a second circuit producing a second data signal, and a third circuit producing a third data signal. In this example, the first circuit includes a first circuit decoding arrangement for decoding the encoded signal to produce or recreate the data signals transmitted from the second and third circuits. The second circuit includes a second circuit decoding arrangement for decoding the encoded signal to produce or recreate the data signals from the first and third circuits. Finally, the third circuit includes a third circuit decoding arrangement for decoding the encoded signal to produce or recreate the data signals from the first and second circuits.

The encoding element includes a resistor in each circuit connected between a signal driver for the respective circuit and the common signal transmission line. These resistors cooperate to produce the encoded signal at a particular voltage level. This encoded signal is representative of a particular combination of digital data signals transmitted by the various circuits in the system. In the example system including three separate circuits each producing a single digital signal, the encoded signal will comprise one signal from a set of eight unique voltage level signals. Each voltage level in the set of signals represents a different combination of digital signals transmitted by each of the circuits in the multi-directional data transmission system.

Decoding the first digital signal transmitted from a first circuit in the system is performed by comparing the encoded signal on the common transmission line to a first reference voltage. Decoding a second digital signal from a second circuit in the system is performed by comparing the encoded signal on the common transmission line to one of two reference voltages depending upon the value of the first digital signal. The first digital signal may be used to control a multiplexer to pass the correct reference voltage for comparison. Decoding a third digital signal from a third circuit in the system is performed by comparing the encoded signal on the common transmission line to one of four reference voltages depending upon the value of the first and second digital signals. An additional multiplexer under the control of the first and second digital signals may be used to pass the correct reference voltage for use in decoding the third digital signal. In each case, the comparison is preferably performed by a differential receiver having a positive input connected to receive the encoded signal on the common transmission line and a negative input connected to receive the appropriate reference voltage.

Each circuit in the multi-directional data communication system includes only the decoding structure required for decoding the signals transmitted from the other circuits in the system. In the three-circuit example, the first circuit includes a first circuit decoding arrangement comprising the multiplexers and differential receivers necessary to decode the second and third signals. The second circuit includes a second circuit decoding arrangement comprising the differential receivers and the additional multiplexer required to decode the first and third digital signals. Finally, the third circuit includes a third circuit decoding arrangement comprising the differential receivers and the multiplexer required to decode the first and second signals.

The present invention is not limited to the three-circuit example set out here for purposes of describing the invention. Rather the concepts of the present invention may be employed in multiplexing N signals on a common transmission line, where N is a positive integer greater than two. The value of N is generally limited by the quality of the differential receivers and the voltage level of the digital signals employed in the circuit system.

The present invention reduces the number of input/output pins on an integrated circuit package required to interconnect the integrated circuits for data communication. Also, the invention reduces the number of transmission lines required for simultaneous, multi-directional data communications between different circuits. Furthermore, by allowing simultaneous data communications between circuits, the invention may increase overall system performance.

These and other objects, advantages, and features of the invention will be apparent from the following description of the preferred embodiments, considered along with the accompanying drawings.

BRIEF DESCRIPTION OF THE DRAWINGS

The following description of preferred embodiments will refer to the accompanying FIGS. 1 through 9 in order to provide a more complete understanding of the present invention.

DESCRIPTION OF THE PREFERRED EMBODIMENTS

The following description sets forth numerous specific details such as voltage and resistance values in order to provide a thorough understanding and description of the present invention. However, it will be apparent to those skilled in the art that the present invention may be practiced without these specific details. Furthermore, well-known circuits have been shown in block diagram form so as not to obscure the present invention in unnecessary detail. Also, timing considerations have been omitted in as much as such details are unnecessary to an understanding of the present invention and are in any event within the knowledge of persons of ordinary skill in the art.

Figure 1:
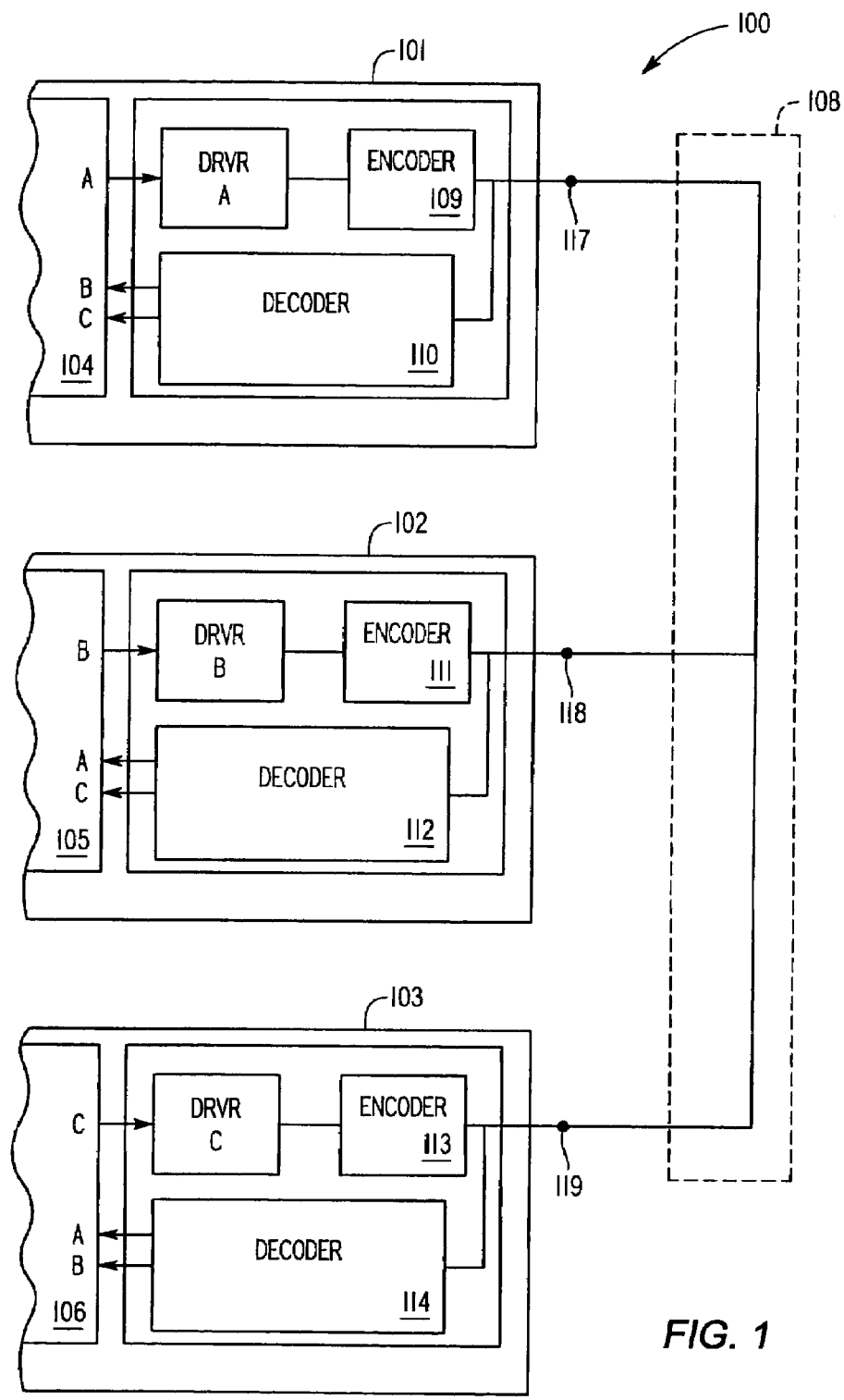
FIG. 1 is a diagrammatic representation of a circuit arrangement embodying the principles of the invention.

Referring to FIG. 1, a system 100 of electronic circuits includes three separate integrated circuit chips 101, 102, and 103. Each of these integrated circuits contains circuitry which operates to produce and use digital signals. Chip 101 includes a first circuit 104 which is adapted to produce a first digital signal, signal A, and to receive and use second and third signals, signals B and C respectively. Chip 102 includes a second circuit 105 which produces digital signal B and receives signals A and C. Chip 103 includes a third circuit 106 which produces the digital signal C and receives signals A and B. The term "digital signal" or "digital data signal" used in this disclosure and the accompanying claims refers to a voltage signal residing at either a logical high level, normally representing the binary value "1," or a logical low level which normally represents the binary value "0." These terms are not intended to imply any particular voltage level for the respective signals since the invention may be employed with digital systems utilizing any voltage level for the respective digital signals.

Each circuit 104, 105, and 106 includes or is associated with a data communications arrangement which enables each circuit to simultaneously transmit its respective digital signal to the other circuits and also receive the digital signals from each other circuit. This simultaneous multi-directional data transmission is carried out over a common transmission line or network 108 connected to each chip. The term "common" in reference to transmission line 108 is intended to indicate that the transmission line is shared among the three separate circuits 104, 105, and 106. Illustrated transmission line 108 is connected to the chips 101, 102, and 103 in a T connection. However, transmission line 108 may alternatively be connected in a "delta" configuration or a "wye" configuration within the scope of the invention.

The term "simultaneously" is used in this disclosure and the accompanying claims to indicate that several signals are asserted, applied, or transmitted at the same time. The term "simultaneously" in this sense is not intended to imply that the multiple signals must be asserted or applied at the same time over the entire duration of each signal. In fact, the various signals may begin and end at different times. The various signals need only appear over a certain common period of time necessary to produce the encoded signal on the common transmission line.

The data communications arrangement associated with first circuit 104 includes sending circuitry including a first driver, DRIVER A, and a first digital signal encoding element 109. The data communications arrangement associated with first circuit 104 also includes a first circuit decoding arrangement 110. Similarly, second circuit 105 includes a second driver, DRIVER B, a second digital signal encoding element 111, and a second circuit decoding arrangement 112. Third circuit 106 includes a third driver, DRIVER C, a third digital signal encoding element 113, and a third circuit decoding arrangement 114. The data communications arrangement associated with first circuit 104 is connected to common transmission line 108 through pin or interface node 117. Second circuit 105 and third circuit 106 are connected to common transmission line 108 through pins 118 and 119, respectively. These pins 117, 118 and 119 represent an input/output pin of the respective chip and/or a signal pad which couples the respective chip to common transmission line 108. These pin connections may each comprise a solder-ball connection commonly referred to in the industry as a C4 connection, for example.

First circuit decoding arrangement 110 is adapted to receive an encoded signal on common transmission line 108 and decode the signal to produce or recreate digital signals B and C, the signals asserted or applied (transmitted) from the other circuits in system 100, circuits 105 and 106. Similarly, second circuit decoding arrangement 112 is adapted to receive and decode the digital signals transmitted from the other circuits in the arrangement, namely signals A and C from the first and third circuits, 104 and 106, respectively. Finally, third circuit decoding arrangement 114 is adapted to receive and decode the digital signals transmitted from the first circuit 104 and second circuit 105, signals A and B respectively.

Figure 2:
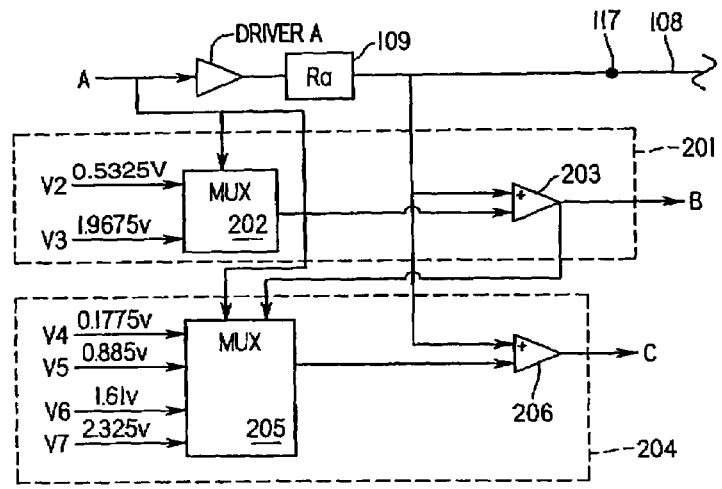
FIG. 2 is an electrical schematic diagram illustrating the encoder and decoder arrangements associated with the first circuit shown in FIG. 1.
Figure 3:
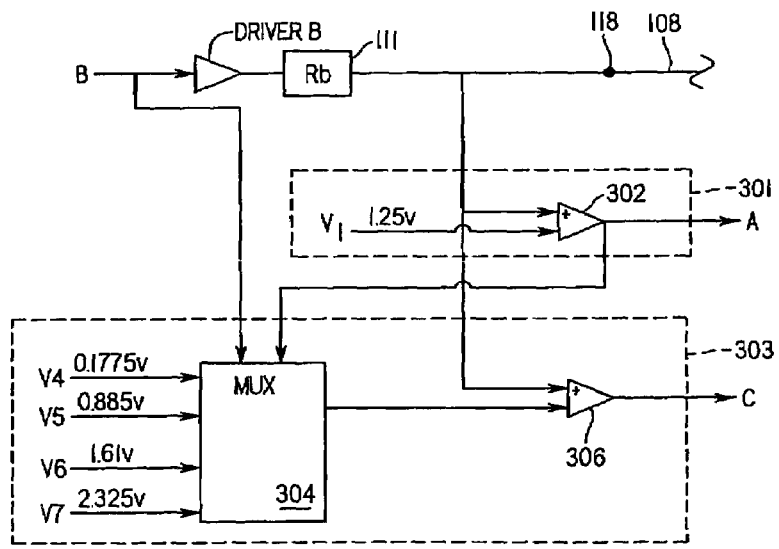
FIG. 3 is an electrical schematic diagram illustrating the encoder and decoder arrangements associated with the second circuit shown in FIG. 1.
Figure 4:
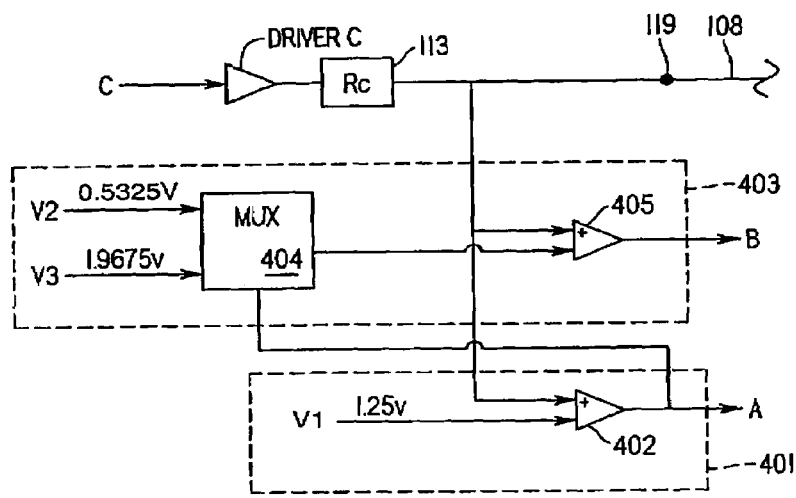
FIG. 4 is an electrical schematic diagram illustrating the encoder and decoder arrangements associated with the third circuit shown in FIG. 1.

Further details of the encoding elements 109, 111, and 113, and the decoding arrangements 110, 112, and 114 may be described with reference to FIGS. 2 through 6. Referring to FIG. 2, encoding element 109 comprises a resistor having resistance value Ra. Encoding elements 111 and 113 also comprise resistors as shown in FIGS. 3 and 4, having resistance values Rb and Rc, respectively. The function of these resistors and example resistance values for Ra, Rb, and Rc will be discussed further below.

Referring again to FIG. 2, first circuit decoding arrangement 110 includes a second signal (signal B) decoding arrangement 201 for decoding signal B from an encoded signal on common transmission line 108. Decoding arrangement 201 includes reference voltage multiplexer 202 and second differential receiver 203. Multiplexer 202 receives second and third reference voltage inputs (V2 and V3) and is controlled by signal A to pass one of those reference voltages to the negative input of second differential receiver 203. The positive input of second differential receiver 203 is connected to receive the encoded signal. First circuit decoding arrangement 110 also includes a third signal (signal C) decoding arrangement 204 for decoding signal C from the encoded signal appearing on transmission line 108. Decoding arrangement 204 includes an additional reference voltage multiplexer 205 and third differential receiver 206. Additional reference voltage multiplexer 205 receives fourth, fifth, sixth, and seventh reference voltages (V4, V5, V6, and V7) as inputs and is controlled by signals A and B to pass one of those reference voltages to the negative input of third differential receiver 206. The positive input of third differential receiver 206 is connected to receive the encoded signal appearing on transmission line 108.

Referring to FIG. 3, second circuit decoding arrangement 112 includes a first signal (signal A) decoding arrangement 301 for decoding signal A from the encoded signal on transmission line 108. Decoding arrangement 301 includes a first differential receiver 302 having a negative input connected to receive a first reference voltage V1 and a positive input connected to receive the encoded signal. A third signal (signal C) decoding arrangement 303 is also included for decoding signal C from the encoded signal. It will be noted that the third signal decoding arrangement 303 in FIG. 3 is identical to third signal decoding arrangement 204 in FIG. 2. Thus, third signal decoding arrangement 303 includes an additional reference voltage multiplexer 304 connected to receive fourth, fifth, sixth, and seventh reference voltages (V4, V5, V6, and V7) as inputs. Additional reference voltage multiplexer 304 is controlled by signals A and B to pass one of those reference voltages to the negative input of a third differential receiver 306. The positive input of third differential receiver 306 is connected to receive the encoded signal appearing on transmission line 108.

Referring to FIG. 4, third circuit decoding arrangement 114 includes a first signal (signal A) decoding arrangement 401 for decoding signal A from the encoded signal on transmission line 108. Decoding arrangement 401 is identical to decoder 301 in FIG. 3 and includes a first differential receiver 402 having a negative input connected to receive a first reference voltage V1, and a positive input connected to receive the encoded signal. Third circuit decoding arrangement 114 also includes a second signal (signal B) decoding arrangement 403 for decoding signal B from the encoded signal on transmission line 108. This second signal decoding arrangement 403 in FIG. 4 is identical to second signal decoding arrangement 201 in FIG. 2. Thus, second signal decoding arrangement 403 includes a reference voltage multiplexer 404 and a second differential receiver 405. Multiplexer 404 receives second and third reference voltage inputs (V2 and V3) and is controlled by signal A to pass one of those reference voltages to the negative input of second differential receiver 405. The positive input of second differential receiver 405 is connected to receive the encoded signal.

The resistance values Ra, Rb, and Rc are selected so that predetermined voltages are transmitted onto the common transmission line 108 connecting first circuit 104, second circuit 105, and third circuit 106. Each predetermined voltage corresponds to a particular combination of digital signals from the first circuit 104, second circuit 105, and third circuit 106. Table 1 shows each predetermined voltage and its corresponding combination of values for digital signals A, B, and C.

| Digital Signal A | Digital Signal B | Digital Signal C | Transmission line 108 |
|---|---|---|---|
| 0 | 0 | 0 | 0 |
| 0 | 0 | 1 | 0.355 volts |
| 0 | 1 | 0 | 0.71 volts |
| 0 | 1 | 1 | 1.06 volts |
| 1 | 0 | 0 | 1.43 volts |
| 1 | 0 | 1 | 1.79 volts |
| 1 | 1 | 0 | 2.143 volts |
| 1 | 1 | 1 | 2.5 volts |

The voltage signals on transmission line 108 represent encoded or combined signals. Each such encoded signal represents the combination of digital signal values shown for signals A, B, and C. The decoding arrangements 110, 112, and 114 associated with circuits 104, 105, and 106 decode these voltage signals to produce or recreate the desired digital signals A, B, and C.

The resistance values shown in Table 1 are predetermined by using a power supply voltage of 2.5 volts, and assumes steady state operation, neglecting transient effects in the transmission line 108. It is assumed that the impedance of transmission line 108 is 50 ohms. For impedance matching, this 50 ohms must be matched using the following formula for the resistance values within the transmission line 108: 1/Ra+1/Rb+1/Rc. Empirically, the value for resistance Ra has been determined to be 87.5 ohms, the value for resistance Rb has been determined to be 175 ohms, and the resistance value for Rc has been determined to be 350 ohms. The derivation of these resistance values is discussed in more detail below.

These resistance values and the digital signal voltage level of 2.5 volts result in the transmission line voltages shown in Table 1 above. Those skilled in the art will appreciate that other resistance values and encoded voltage signals can be utilized to achieve the multi-directional data transmission goal of the present invention. It will also be appreciated that the invention assumes that the electrical resistance in the transmission line 108 itself is negligible. Thus, with current transmission line technology, the multi-directional simultaneous signal transmission arrangement according to the invention is suitable for situations in which the transmission line 108 is relatively short, on the order of 2 to 3 centimeters.

This short transmission line length reduces the effect of the transmission line so that it can be treated as a lump capacitance and resistance. Furthermore, the transmission line effect is essentially eliminated when the time of flight along the line is less than half the transition time of the driver output.

Table 1 shows that for all logical "0" values for signal A, the encoded signal voltage is 1.06 volts or less, and for all logical "1" values of signal A, the encoded signal voltage on transmission line 108 is 1.43 volts or greater. The average of 1.43 volts and 1.06 volts is 1.25 volts. This is the value that is input to first differential receiver 302 and first differential receiver 402 as reference voltage V1 in order to decode the logical level of digital signal A. Thus, for all encoded signal voltages transmitted along transmission line 108 and received at the positive input of first differential receivers 302 and 402 (FIGS. 3 and 4) having a value less than 1.25 volts, the output of respective differential receiver will be a logical "0," which corresponds to the level of digital signal A driven by driver A (FIGS. 1 and 2). However, if the encoded voltage signal on transmission line 108 is greater than 1.25 volts, first differential receivers 302 and 402 will each output a logical "1" level signal, thus accurately recreating or reproducing digital signal A as indicated in Table 1.

Referring still to Table 1, digital signal A must first be decoded or be available in order to decode the second digital signal, signal B. If digital signal A is at a logical "0" level, then digital signal B is a logical "0" level signal for voltages less than 0.5325 volts (which is the average of 0.355 volts and 0.71 volts). A logical level "1" for digital signal B can be recreated or reproduced when digital signal A has a logical "0" level, and the signal on transmission line 108 is greater than 0.5325 volts. Likewise, when digital signal A is at a logical "1" level, the dividing line for determining if digital signal B is a logical "0" or logical "1" signal is 1.9675 volts, which is the average of 1.79 volts and 2.143 volts.

Thus, to decode digital signal B, the encoded signal on transmission line 108 is compared by the second differential receiver (203 in FIG. 2 and 405 in FIG. 4) to either the 0.5325 volt reference signal or the above noted 1.9675 volt reference signal. These two reference voltages comprise the second and third reference voltage inputs, V2 and V3 respectively, to multiplexer 202 in FIG. 2 and 404 in FIG. 4. Multiplexer 202 uses the first digital signal, signal A to choose between these two input reference voltages to apply to the negative input of second differential receiver 203. Similarly, multiplexer 404 uses the first digital signal, signal A to choose between second reference voltage input V2 and third reference voltage input V3 to apply to the negative input of second differential receiver 405.

Figure 5:
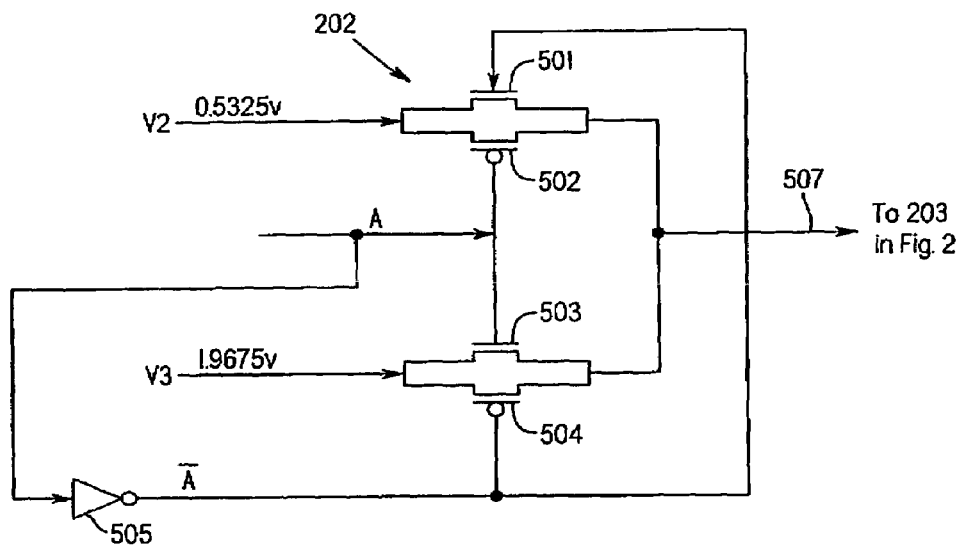
FIG. 5 in an electrical schematic diagram illustrating the reference voltage multiplexer shown in FIGS. 2 and 4.

Referring next to FIG. 5, reference voltage multiplexer 202 includes two N-channel field effect transistors ("FETs") 501 and 503, and two P-channel FETs 502 and 504. The 0.5325 volt reference voltage V2 is received by transistors 501 and 502, while the 1.9675 volt reference voltage V3 is received by transistors 503 and 504. Signal A is applied to the gate electrodes of transistors 502 and 503, and is inverted through inverter 505 and the inverted signal applied to the gate electrodes of transistors 501 and 504.

In the case where the value of digital signal A is a logical "0" value, the second reference voltage V2, 0.5325 volts, will be passed through devices 501 and 502 to multiplexer output line 507. This line passes the voltage signal to the negative input of second differential receiver 203. If the encoded signal voltage applied to the positive input of second differential receiver 203 is less than the 0.5325 volt reference voltage, then the receiver will output a logical "0" value comprising the decoded digital signal B. If the encoded signal on transmission line 108 is greater than the 0.5325 volt reference voltage V2, then second differential receiver 203 will produce a logical "1" level output as digital signal B.

Should digital signal A comprise a logical "1" level signal, transistors 501 and 502 are placed in a non-conducting state, and transistors 503 and 504 will pass the third reference voltage V3 of 1.9675 volts to multiplexer output line 507 to be applied to the negative input of second differential receiver 203. Should the encoded signal on transmission line 108 be less than 1.9675 volts, then second differential receiver 203 will output in logical "0" level signal. If the encoded signal has a voltage greater than 1.9675 volts, then second differential receiver 203 will produce a logical level "1" output.

Although the above description of FIG. 5 references multiplexer 202 and second differential receiver 203 shown in FIG. 2, the identical structure and description applies to multiplexer 404 and second differential receiver 405 shown in FIG. 4.

In order to decode the third digital signal, signal C, from the encoded signal appearing on transmission line 108, it is necessary to know logical levels of digital signals A and B either as they have been decoded or as they are produced by the respective circuit. Digital signals A and B are used to apply the appropriate reference voltage signal V4, V5, V6, or V7 (FIGS. 2 and 3) for comparison with the encoded signal on common transmission line 108 to produce the correct logical value for signal C. The comparison is made by third differential receiver 206 in FIG. 2 or 306 in FIG. 3.

Figure 6:
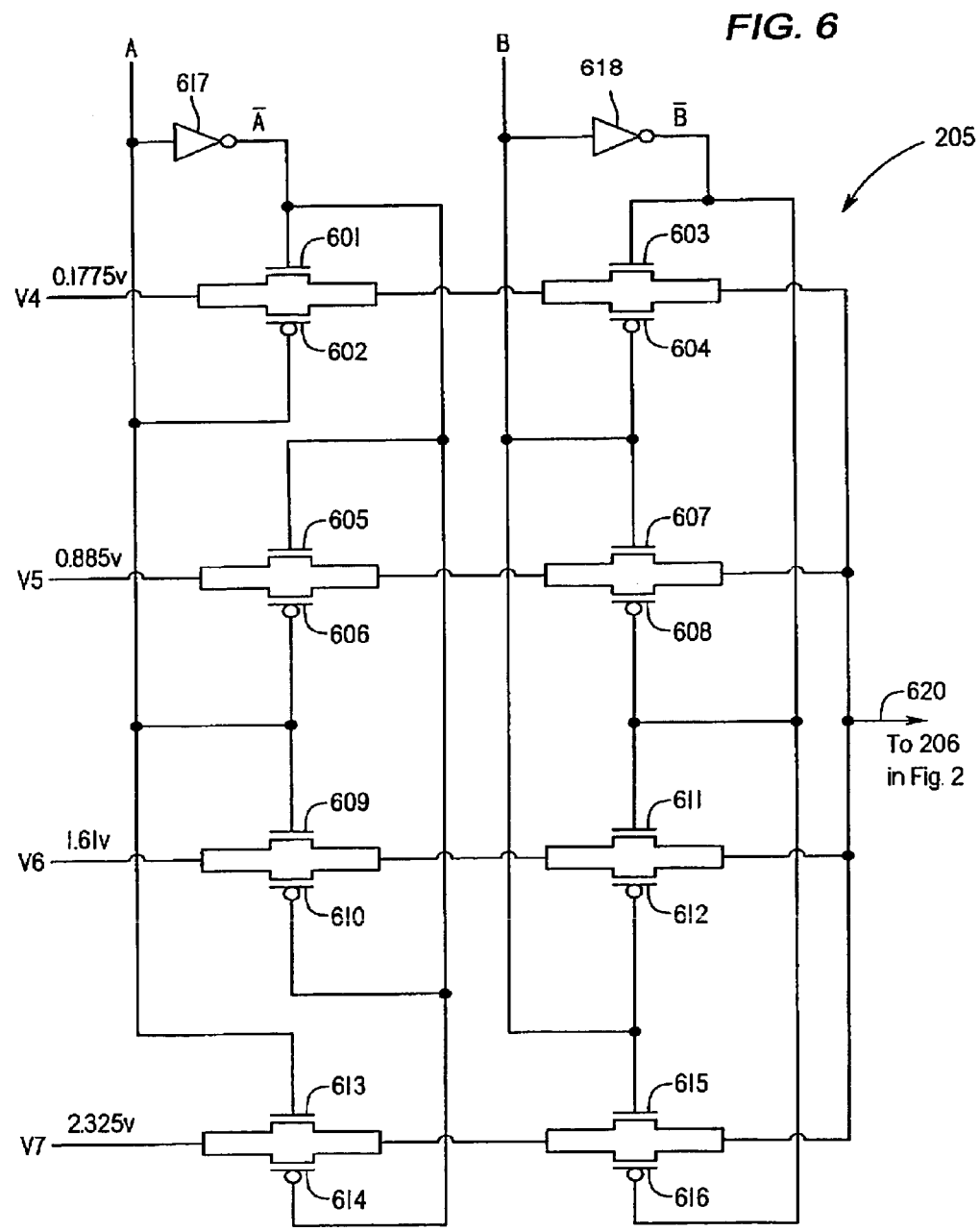
FIG. 6 is an electrical schematic diagram illustrating the additional reference voltage multiplexer shown in FIGS. 2 and 3.

FIG. 6 shows a multiplexer suitable for use as an additional reference voltage multiplexer 205 and 304 for applying the appropriate reference voltage to the respective third differential receiver 206 or 306 in order to provide the appropriate comparison required to recreate or reproduce digital signal C from the encoded signal appearing on common transmission line 108. Although the following description will refer to additional reference voltage multiplexer 205 in FIG. 2, the same description applies to additional reference voltage multiplexer 304 and third differential receiver 306 in FIG. 3. Additional reference voltage multiplexer 205 utilizes N-channel FETs 601, 603, 605, 607, 609, 611, 613, and 615 along with P-channel FETs 602, 604, 606, 608, 610, 612, 614, and 616. The parallel connected conduction paths of devices 601 and 602 are connected in series with the parallel connected conduction paths of devices 603 and 604 to provide a first conduction route through additional reference voltage multiplexer 205. This conduction route selectively passes the fourth reference voltage V4 (0.1775 volts) to multiplexer output line 620 which is connected to the negative input of third differential receiver 206. Similarly, the parallel connected conduction paths of devices 605 and 606 are connected in series with the parallel connected conduction paths of devices 607 and 608 to provide a second conduction route through additional reference voltage multiplexer 205. This second route selectively applies the fifth reference voltage V5 (0.885 volts) to the multiplexer output 620. In the same fashion, the parallel connected conducting paths of devices 609 and 610 are connected in series with the parallel connected conduction paths of devices 611 and 612 to provide a third conduction route through additional reference voltage multiplexer 205. This conduction route is used to selectively apply the sixth reference voltage V6 (1.61 volts in this example) to multiplexer output 620. Finally, the parallel connected conduction paths of devices 613 in 614 are connected in series with the parallel connected conducting paths of devices 615 and 616 to form the fourth and final conduction route through additional reference voltage multiplexer 205. This final conduction route selectively conducts the seventh reference voltage V7 (2.325 volts) to multiplexer output 620.

The gate electrodes of devices 602, 606, 609, and 613 receive digital signal A, while the gate electrodes of devices 601, 605, 610, and 614 receive the inverted digital signal A, produced using inverter 617. Digital signal B is applied to the gate electrodes of devices 604, 607, 612, and 615. Signal B is also inverted at inverter 618 and the inverted signal is applied to the gate electrodes of devices 603, 608, 611, and 616.

Referring to Table 1, when digital signal A and digital signal B both have logical 0 levels, devices 601, 602, 603, 604, 605, 606, 611, and 612 will be placed in a conductive state. This will result in the reference voltage 0.1775 being applied to multiplexer output 620. The signal is then supplied as the negative input to third differential receiver 206. If the voltage of the encoded signal on transmission line 108 is less than 0.1775 volts then third differential receiver 206 will produce an output at a logical "0" level comprising the decoded signal C. Should the voltage of the encoded signal be greater than the 0.1775 volt reference voltage, third differential receiver 206 will output a logical "1" digital signal. If the value of digital signal A is "0" and the value of signal B is "1," the 0.3875 volt reference voltage is applied to the multiplexer output 620 and to the negative input of third differential receiver 206. Where digital signal A is a logical "1" and signal B is a logical "0," then additional reference voltage multiplexer 205 will pass the reference voltage of 1.61 volts to multiplexer output 620 and the negative input of third differential receiver 206. Finally, if both signals A and B are at the logical "1" level, then additional reference voltage multiplexer 205 passes the reference voltage of 2.325 volts to multiplexer output 620 and the negative input of third differential receiver 206.

It should be noted that although the pass gates shown in FIGS. 5 and 6 include a PFET and NFET pair for each pass gate, this is not necessarily required, depending on the DC reference voltage tied to the respective pass gate. For a relatively low reference voltage, such as V2, V4, V5 and V6, the PFET in the respective pass gate may be omitted. For a relatively high reference voltage, such as V7, the NFET in the pass gate may be omitted. For a generally mid-level reference voltage between ground and the supply voltage, either the NFET or PFET in the respective pass gate may be omitted.

The reference voltages V1 through V7 described above may be derived or produced in any suitable manner within the scope of the present invention. One preferred form of the invention utilizes a voltage divider arrangement for deriving the various reference voltages. The basic structure of such a voltage divider arrangement is well within the knowledge of one of ordinary skill in this art, and thus this structure will not be described here in detail. It will be noted, however, that the resistances used in the voltage divider arrangement may be conveniently created using the on-chip layer BR mask. Alternatively, the required resistances may be embodied in any suitable form.

The derivation of resistance values Ra, Rb, and Rc will now be described with reference to Table 1. This derivation is identical to that set out in U.S. Pat. No. 5,761,246, the entire content of which is hereby incorporated herein by this reference. Because of rotational symmetry of Ra, Rb, and Rc, it is only necessary to analyze the first half of the table.

Case 1

Figure 7:
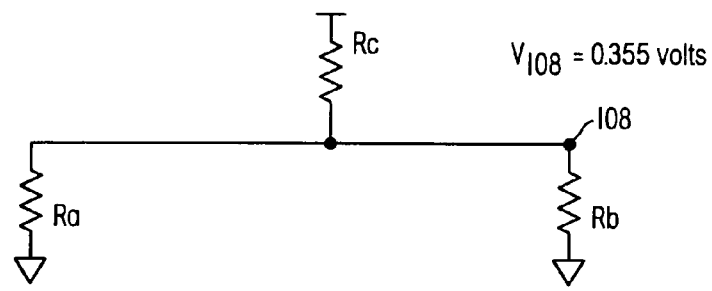
FIGS. 7 through 9 are electrical schematic diagrams illustrating how the encoder resistance values are derived.

The second line of the table states that when digital signal A=logic "0", digital signal B=logic "0", and digital signal C=logic "1", the voltage on common transmission line 108 is 0.355 volts. That corresponds to the case illustrated in FIG. 7.

Voltage divider principle yields the equation:

$$(Ra//Rb)/((Ra//Rb)+Rc) \times Vdd = 0.355 \text{ volts} \quad (1)$$

$$(Ra//Rb)/((Ra//Rb)+Rc) \times 2.5 = 0.355 \text{ volts} \quad (2)$$

$$(RaRb/(Ra+Rb))/((RaRb/(Ra+Rb))+Rc) = 1/7 \quad (3)$$

$$RaRb/(RaRb+RaRc+RbRc) = 1/7 \quad (4)$$

Case 2

Figure 8:
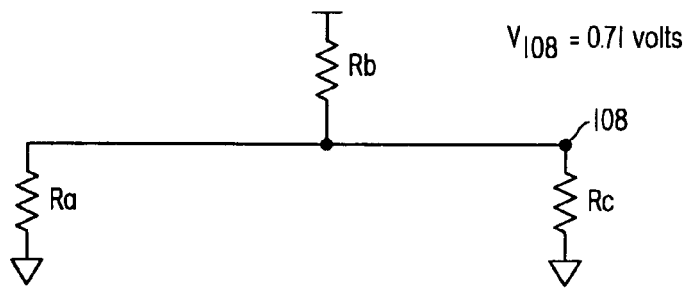

Similarly, the third line of the table leads to the following equations (see FIG. 8):

$$(Ra//Rc)/((Ra//Rc)+Rb) \times 2.5 \text{ volts} = 0.71 \text{ volts} \quad (5)$$

$$RaRc/(RaRb+RaRc+RbRc) = 2/7 \quad (6)$$

Case 3

Figure 9:
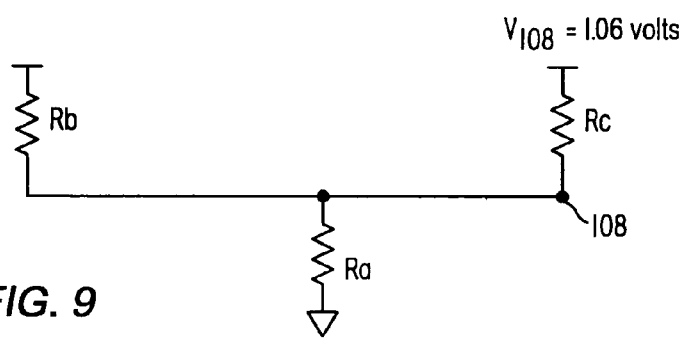

Similarly, the fourth line of the table leads to the following equations (see FIG. 9):

$$Ra/((Rb//Rc)+Ra) \times 2.5 \text{ volts} = 1.06 \text{ volts} \quad (7)$$

$$(Ra(Rb+Rc))/(RaRb+RaRc+RbRc) = 3/7 \quad (8)$$

Case 4

To match with transmission line impedance:

$$1/Ra+1/Rb+1/Rc+1/Zo \quad (9)$$

with Zo=50Ω

$$1/Ra+1/Rb+1/Rc = 1/50 \quad (10)$$

Now we have four equations of three unknowns. They are equations (4), (6), (8) and (10). They are repeated here for convenience:

$$RaRb/(RaRb+RaRc+RbRc) = 1/7 \quad (4)$$

$$RaRc/(RaRb+RaRc+RbRc) = 2/7 \quad (6)$$

$$(Ra(Rb+Rc))/(RaRb+RaRc+RbRc) = 3/7 \quad (8)$$

$$1/Ra+1/Rb+1/Rc = 1/50 \quad (10)$$

Comparing equation (4) and (6) leads to the result:

$$Rc = 2Rb \quad (11)$$

Substitute Rc=2Rb in equation (8):

$$Ra(3Rb)/(RaRb)+(2RaRb)+(2Rb^2) = 3/7 \quad (12)$$

$$Ra/(Ra+2Ra+2Rb) = 1/7 \quad (13)$$

$$Ra/(3Ra+2Rb) = 1/7 \quad (14)$$

$$7Ra = 3Ra+2Rb \quad (15)$$

$$4Ra = 2Rb \quad (16)$$

$$Ra = \tfrac{1}{2}Rb \quad (17)$$

To summarize equations (11) and 17):

$$Rc = 4Ra \quad (18)$$

$$Rb = 2Ra \quad (19)$$

Substituting equations (18) and (19) into equation (10):

$$1/Ra+1/2Ra+1/4Ra=1/50 \qquad (20)$$

$$1/Ra(1+\tfrac{1}{2}+\tfrac{1}{4})=1/50 \qquad (21)$$

$$1.75/Ra=1/50 \qquad (22)$$

$$Ra=87.5\Omega \qquad (23)$$

Equation (23) helps to solve for Rb and Rc:

$$Rb=2Ra=2(87.5)=175\Omega \qquad (24)$$

$$Rc=4Ra=4(87.5)=350\Omega \qquad (25)$$

So the values of Ra, Rb, and Rc should be:

$$Ra=87.5\Omega$$

$$Rb=175\Omega$$

$$Rc=350\Omega$$

The above described preferred embodiments are intended to illustrate the principles of the invention, but not to limit the scope of the invention. Various other embodiments and modifications to these preferred embodiments may be made by those skilled in the art without departing from the scope of the following claims. For example, the three-circuit arrangement in the figures is shown only for purposes of example. The principles and of invention are applicable to circuit arrangements including more circuits which communicate signals to each other. Also, although the circuits 104, 105, and 106 are illustrated as being included on separate integrated circuit chips, the circuits may be on the same chip within the scope of the invention and the following claims.

The invention claimed is:

1. An electronic circuit adapted to send a signal to two or more separate electronic circuits over a common transmission line while simultaneously receiving signals from the two or more separate electronic circuits over the common transmission line, the electronic circuit comprising:
 (a) signal sending circuitry coupled to an interface node which is adapted to be coupled to the common transmission line, the signal sending circuitry creating a combined signal at the interface node, the combined signal being dependent on the signal from the electronic circuit and the signals simultaneously applied by the two or more separate electronic circuits connected at other points to the common transmission line; and
 (b) decoding circuitry coupled to the interface node, the decoding circuitry detecting the combined signal at the interface node and decoding the signals from the two or more separate electronic circuits responsive to the combined signal.

2. The electronic circuit of claim 1 wherein the signal sending circuitry comprises:
 (a) a signal driver; and
 (b) an encoding element connected between the signal driver and the interface node.

3. The electronic circuit of claim 2 wherein the encoding element comprises a resistor.

4. The electronic circuit of claim 1 wherein the decoding circuitry comprises:
 (a) a first differential receiver having a positive input connected to receive the combined signal and having a negative input connected to a first reference voltage source.

5. The electronic circuit of claim 1 wherein the decoding circuitry comprises:
 (a) a reference voltage multiplexer connected to receive a first digital signal as a control signal, and having second and third reference voltage inputs;
 (b) a second differential receiver having a positive input connected to receive the combined signal, and a negative input connected to receive an output of the reference voltage multiplexer.

6. The electronic circuit of claim 1 wherein the decoding circuitry comprises:
 (a) an additional reference voltage multiplexer connected to be controlled by a first digital signal and a second digital signal and having fourth, fifth, sixth, and seventh reference voltage inputs; and
 (b) a third differential receiver having a positive input connected to receive the combined signal and a negative input connected to receive an output from the additional reference voltage multiplexer.

7. An electronic circuit arrangement comprising:
 (a) three or more circuits connected together by a common transmission line, each circuit adapted to assert a respective digital signal;
 (b) each circuit including sending circuitry connected to the common transmission line, the sending circuitry of the respective circuits cooperating to produce an encoded signal on the transmission line based upon the values of the respective digital signals asserted by the respective circuits, the encoded signal comprising one signal from a set of unique encoded signals with each different signal in the set being representative of a particular combination of digital signals asserted simultaneously from the respective circuits; and
 (c) each circuit further including a decoding arrangement for decoding the encoded signal appearing on the common transmission line to produce the digital signals asserted from each other circuit.

8. The electronic circuit arrangement of claim 7 wherein each circuit is located on a separate integrated circuit chip and the common transmission line comprises a conductor connected to a single electrode on each separate integrated circuit chip.

9. The electronic circuit arrangement of claim 7 wherein the signal sending circuitry in each respective circuit includes an encoding element comprising a resistor.

10. The electronic circuit arrangement of claim 7 wherein the three or more circuits includes a first circuit providing a first digital signal, a second circuit providing a second digital signal and a third circuit providing a third digital signal, and wherein the decoding arrangement associated with the second and third circuits includes a first digital signal decoding arrangement comprising:
 (a) a first differential receiver having a positive input connected to receive the encoded signal and having a negative input connected to a first reference voltage source.

11. The electronic circuit arrangement of claim 7 wherein the three or more circuits includes a first circuit providing a first digital signal, a second circuit providing a second digital signal, and a third circuit providing a third digital signal, and wherein the decoding arrangement associated with the first and third circuits includes a second digital signal decoding arrangement comprising:

(a) a reference voltage multiplexer connected to receive the first digital signal as a control signal, and having second and third reference voltage inputs;

(b) a second differential receiver having a positive input connected to receive the encoded signal, and a negative input connected to receive an output of the reference voltage multiplexer.

12. The electronic circuit arrangement of claim 7 wherein the three or more circuits includes a first circuit providing a first digital signal, a second circuit providing a second digital signal, and a third circuit providing a third digital signal, and wherein the decoding arrangement associated with the first and second circuits includes a third digital signal decoding arrangement comprising:

(a) an additional reference multiplexer connected to be controlled by the first digital signal and second digital signal, and having fourth, fifth, sixth, and seventh reference voltage inputs; and (b) a third differential receiver having a positive input connected to receive the encoded signal and a negative input connected to receive an output from the additional reference voltage multiplexer.

13. An electronic system having a first circuit producing a first digital signal, a second circuit producing a second digital signal, and a third circuit producing a third digital signal, the system comprising:

(a) a first circuit encoding element included in the first circuit, a second circuit encoding element included in the second circuit, and a third circuit encoding element included in the third circuit, each respective encoding element connected between a digital signal output of the respective circuit and a common transmission network between the first, second, and third circuits, the first, second, and third encoding elements cooperating to produce an encoded signal on the common transmission network based upon the values of the first, second, and third digital signals, the encoded signal comprising one signal from a set of unique encoded signals with each different signal in the set being representative of a particular combination of the first, second, and third digital signals; and (b) a first circuit decoding arrangement included with the first circuit, a second circuit decoding arrangement included with the second circuit, and a third circuit decoding arrangement included with the third circuit, the respective decoding arrangement for each respective circuit for decoding the encoded signal to produce the digital signals produced by each other circuit in the system.

14. The electronic system of claim 13 wherein the encoding elements each comprise a resistor.

15. The electronic system of claim 13 wherein the first circuit decoding arrangement comprises:

(a) a reference voltage multiplexer connected to be controlled by the first digital signal and connected to receive second and third reference voltage signals as inputs;

(b) a second differential receiver having a positive input connected to receive the encoded signal and a negative input connected to receive a reference voltage multiplexer output;

(c) an additional reference voltage multiplexer connected to be controlled by the first digital signal and the second digital signal, and connected to receive fourth, fifth, sixth, and seventh reference voltage signals as inputs; and (d) a third differential receiver having a positive input connected to receive the encoded signal and a negative input connected to receive an output of the additional reference voltage multiplexer.

16. The electronic system of claim 13 wherein the second circuit decoding arrangement comprises:

(a) a first differential receiver having a positive input connected to receive the encoded signal and a negative input connected to receive a first reference voltage signal;

(b) an additional reference voltage multiplexer connected to be controlled by the first digital signal and the second digital signal, and connected to receive fourth, fifth, sixth, and seventh reference voltage signals as inputs; and (c) a third differential receiver having a positive input connected to receive the encoded signal and a negative input connected to receive art output of the additional reference voltage multiplexer.

17. The electronic system of claim 13 wherein the third circuit decoding arrangement comprises:

(a) a first differential receiver having a positive input connected to receive the encoded signal and a negative input connected to receive a first reference voltage signal;

(b) a reference voltage multiplexer connected to be controlled by the first digital signal and connected to receive second and third reference voltage signals as inputs; and (c) a second differential receiver having a positive input connected to receive the encoded signal and a negative input connected to receive an output of the reference voltage multiplexer.

* * * * *